(12) United States Patent
Mizuuchi (10) Patent No.: US 11,476,406 B2
(45) Date of Patent: Oct. 18, 2022

(54) DISPLACEMENT MAGNIFICATION DEVICE

(71) Applicant: Azbil Corporation, Tokyo (JP)

(72) Inventor: Takao Mizuuchi, Tokyo (JP)

(73) Assignee: AZBIL CORPORATION, Tokyo (JP)

( * ) Notice: Subject to any disclaimer, the term of this patent is extended or adjusted under 35 U.S.C. 154(b) by 454 days.

(21) Appl. No.: 16/785,835

(22) Filed: Feb. 10, 2020

(65) Prior Publication Data

US 2020/0266331 A1 Aug. 20, 2020

(30) Foreign Application Priority Data

Feb. 19, 2019 (JP) .............................. JP2019-027169

(51) Int. Cl.
| | | |
|---|---|---|
| *H01L 29/84* | (2006.01) | |
| *H01L 21/00* | (2006.01) | |
| *H01L 41/053* | (2006.01) | |
| *H01L 41/083* | (2006.01) | |
| *H01L 41/08* | (2006.01) | |

(52) U.S. Cl.
CPC ........ *H01L 41/0536* (2013.01); *H01L 41/083* (2013.01); *H01L 41/0825* (2013.01)

(58) Field of Classification Search
CPC ........................ H01L 41/0536; H01L 41/0825
USPC .............................. 438/50–53; 257/254, 419
See application file for complete search history.

(56) References Cited

U.S. PATENT DOCUMENTS

| | | | | |
|---|---|---|---|---|
| 6,924,586 B2 * | 8/2005 | Moler | .................... | F04B 17/003 |
| | | | | 310/328 |
| 7,332,848 B2 * | 2/2008 | Mori | ..................... | H02N 2/043 |
| | | | | 310/328 |
| 9,496,478 B2 * | 11/2016 | Mori | ........................ | H02N 2/04 |

FOREIGN PATENT DOCUMENTS

| | | |
|---|---|---|
| JP | 2005-261167 A | 9/2005 |
| JP | 5025949 B2 | 9/2012 |

OTHER PUBLICATIONS

Nobuhiko Henmi et al., "Fast drive of displacement magnification mechanism with flexure hinge using loading type impact damper," Journal of Mechanical Science and Technology, vol. 24, pp. 211-214 (2010), Springer.

Korean Intellectual Property Office, "Notification of Reason for Refusal," issued in Korean Patent Application No. 10-2019-0176525, which is a counterpart to U.S. Appl. No. 16/785,835, dated Jun. 22, 2021, 8 pages (4 pages of English translation of Office Action, and 4 pages of original Office Action).

* cited by examiner

*Primary Examiner* — Calvin Lee (57) ABSTRACT

A displacement magnification device has a first link portion including a first rigid body and a first plate spring that couples the first rigid body to a supporting portion and a movable portion. A second link portion includes a second rigid body and a second plate spring that couples the second rigid body to the supporting portion and the movable portion. In this structure, the first rigid body and the second rigid body play roles to suppress the bending of the first plate spring and the second plate spring. In addition, a connection portion between the first plate spring and the supporting portion, a connection portion between the second plate spring and the supporting portion, a connection portion between the first plate spring and the movable portion, and a connection portion between the second plate spring and the movable portion play roles of elastic hinges.

14 Claims, 6 Drawing Sheets

DISPLACEMENT MAGNIFICATION DEVICE

CROSS-REFERENCE TO RELATED APPLICATION

The present application claims the benefit of and priority to Japanese Patent Application No. 2019-027169, filed on Feb. 19, 2019, the entire contents of which are incorporated by reference herein.

TECHNICAL FIELD

The present invention relates to a displacement magnification device and, more particularly, to a displacement magnification device having a piezoelectric element and a displacement magnification mechanism.

BACKGROUND

Figure 7:
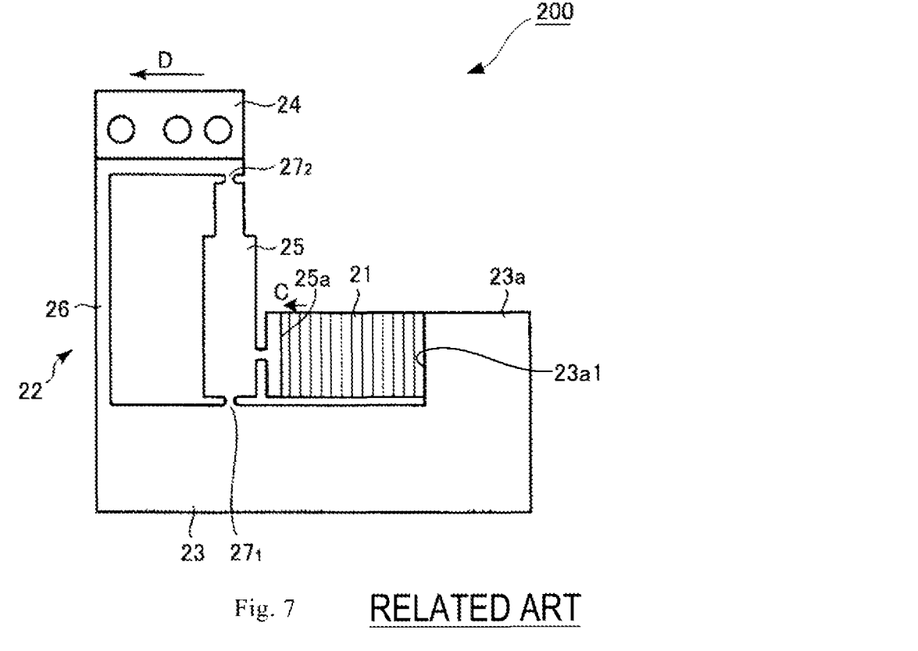
FIG. 7 is a plan view illustrating a conventional displacement magnification device.
Figure 8:
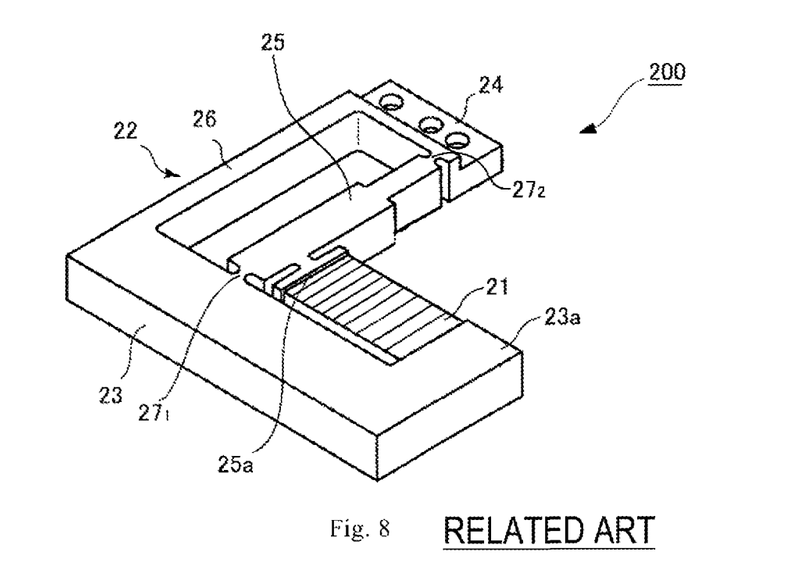
FIG. 8 is a perspective view illustrating the conventional displacement magnification device.

A displacement magnification device having a piezoelectric element and a displacement magnification mechanism has been conventionally used as a displacement magnification device. FIGS. 7 and 8 are a plan view and a perspective view illustrating a conventional displacement magnification device (see, for example, PTL 1). This displacement magnification device 200 includes a piezoelectric element 21 and a displacement magnification mechanism 22 that magnifies the displacement of the piezoelectric element 21.

The displacement magnification mechanism 22 includes a supporting portion 23 that supports the piezoelectric element 21, a rectangular columnar movable portion 24 facing and spaced apart from the supporting portion 23 substantially in parallel, and a pair of mutually parallel link portions (first link portion 25 and second link portion 26) that couple the supporting portion 23 to the movable portion 24 and these portions are formed integrally with each other.

The first link portion 25 is formed in a rectangular column and both ends thereof are coupled to the supporting portion 23 and the movable portion 24 via elastic hinges $27_1$ and $27_2$ with small widths. In addition, the second link portion 26 is a thin column and functions as a plate spring. The piezoelectric element 21 is fixed between a side wall surface 23a1 of a seat portion 23a provided integrally with the supporting portion 23 and a pressure receiving surface 25a integrally projecting from a side surface of the first link portion 25.

When the piezoelectric element 21 is minutely displaced in the direction indicated by arrow C in this displacement magnification device 200, the force generated by this displacement is transmitted to the first link portion 25 via the pressure receiving surface 25a. Then, the first link portion 25 having received the force from the piezoelectric element 21 is inclined about the elastic hinge $27_1$ as the fulcrum with the principle of leverage, the second link portion 26 is also inclined by following the first link portion 25, and the movable portion 24 moves in the direction indicated by arrow D.

That is, when the piezoelectric element 21 is minutely displaced in this displacement magnification device 200, the displacement magnification mechanism 22 like a substantially rectangular frame formed by the supporting portion 23, the movable portion 24, the first link portion 25, and the second link portion 26 is displaced and deformed to a parallelogram frame. This causes the displacement magnification mechanism 22 to magnify the amount of displacement of the piezoelectric element 21 and to output the magnified amount as the amount of displacement of the movable portion 24.

CITATION LIST

Patent Literature

PTL 1: Japanese Patent No. 5025949

SUMMARY

In this displacement magnification device 200, the supporting portion 23, the movable portion 24, the first link portion 25, and the second link portion 26 are integrated, and the elastic hinges $27_1$ and $27_2$ need to be created in this integrated single component. However, since the width of the elastic hinges $27_1$ and $27_2$ is small, creation with a general machining method, such as milling, is difficult. Accordingly, a special machining method, such as wire-cutting, is conventionally used, but the workability of this machining method is bad, thereby causing reduction in productivity.

The invention addresses such a problem with an object of providing a displacement magnification device capable of improving productivity.

To achieve the object described above, a displacement magnification device according to the invention comprises a piezoelectric element (1); and a displacement magnification mechanism (2) configured to magnify an amount of displacement of the piezoelectric element, in which the displacement magnification mechanism comprises a supporting portion (3) supporting the piezoelectric element, a movable portion (4) facing and spaced apart from the supporting portion, and a pair of mutually parallel link portions (5) and (6) coupling the supporting portion to the movable portion, and in which the piezoelectric element is mounted to the supporting portion so as to be displaced orthogonally to a direction in which the supporting portion faces the movable portion, one link portion (5) of the pair of link portions comprises a first rigid body (8) having a pressure receiving surface (8a1) that receives a force generated by displacement of the piezoelectric element and a first plate spring (9) that couples the first rigid body to the supporting portion and the movable portion.

When the piezoelectric element is minutely displaced in the invention, the force generated by this displacement is transmitted to one (first link portion) of the pair of link portions via the pressure receiving surface of the first rigid body. Then, the first link portion having received the force from the piezoelectric element is inclined about the connection portion between the first plate spring and the supporting portion as the fulcrum with the principle of leverage, the other link portion (second link portion) of the pair of link portions is also inclined by following the first link portion, and the movable portion moves in the direction orthogonal to the direction in which the supporting portion faces the movable portion.

In the invention, the first rigid body plays a role to suppress the bending of the first plate spring. In addition, the connection portion between the first plate spring and the supporting portion and the connection portion between the first plate spring and the movable portion play the roles of elastic hinges. This eliminates the need to create elastic hinges with a small width in one component in the invention, and a general machining method such as milling can be adopted.

In the invention, the first plate spring may comprise one plate spring ($7_0$) or two plate springs ($7_1$) and ($7_2$). When the first plate spring comprises one plate spring, this plate spring is stretched between the supporting portion and the movable portion, one end of the plate spring is fixed to the supporting portion, and the other end of the plate spring is fixed to the movable portion. When the first plate spring comprises two plate springs, one end of one of the two plate springs is fixed to the supporting portion and the other end of the one of the two plate springs is fixed to the first rigid body. In addition, one end of the other of the two plate springs is fixed to the movable portion and the other end of the other of the two plate springs is fixed to the first rigid body.

In addition, in the invention, the other link portion (6) of the pair of link portions may include the second rigid body (10) located between the supporting portion and the movable portion and the second plate spring (9) that couples the second rigid body to the supporting portion and the movable portion.

It should be noted here that components in the drawings that correspond to components of the invention are represented as an example by reference numerals enclosed by parentheses in the above description.

As described above, since one of a pair of link portions comprises the first rigid body having the pressure receiving surface that receives the force generated by displacement of the piezoelectric element and the first plate spring that couples the first rigid body to the supporting portion and the movable portion in the invention, elastic hinges with a small width do not need to be created in one component, manufacture becomes easy by adopting a general machining method, such as milling, and productivity is improved.

DETAILED DESCRIPTION

Embodiments of the invention will be described in detail below with reference to the drawings.

Embodiment 1

Figure 1:
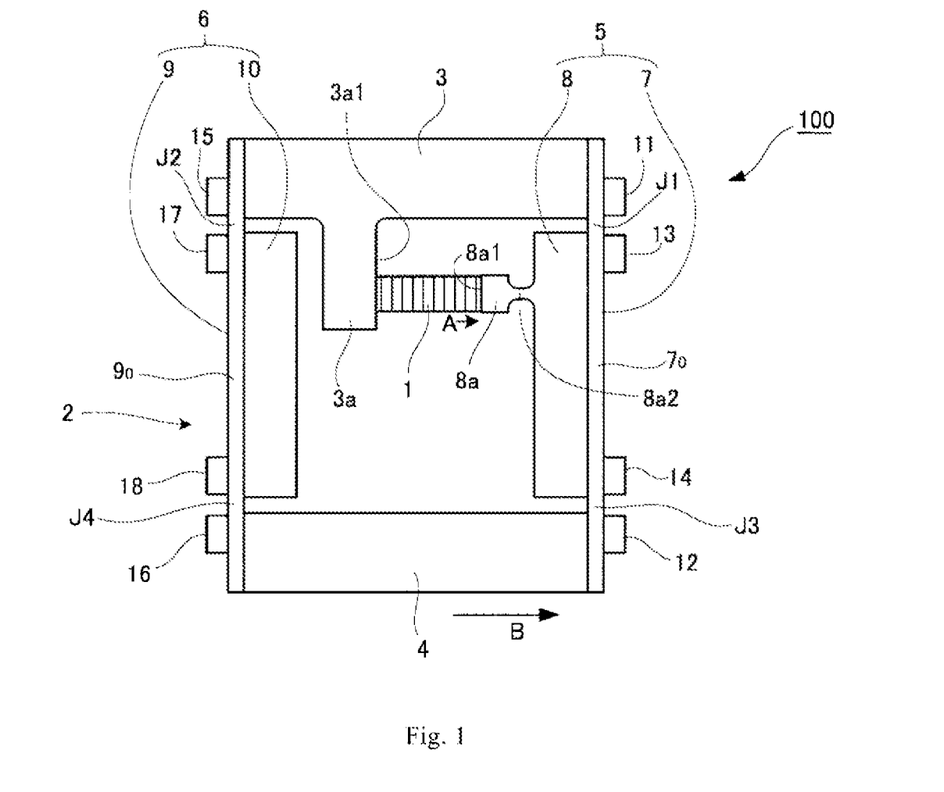
FIG. 1 is a plan view illustrating a main part of a displacement magnification device according to embodiment 1 of the invention.
Figure 2:
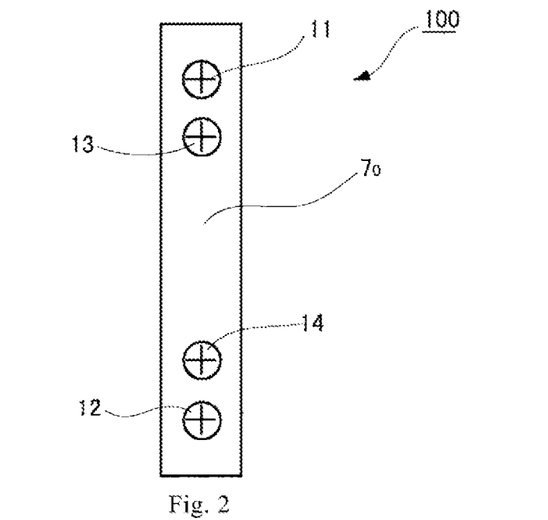
FIG. 2 is a side view illustrating the displacement magnification device according to embodiment 1.

FIG. 1 is a plan view illustrating a main part of a displacement magnification device 100 according to embodiment 1 of the invention and FIG. 2 is a side view thereof. This displacement magnification device 100 comprises a piezoelectric element 1 and a displacement magnification mechanism 2 that magnifies the displacement of the piezoelectric element 1.

In this displacement magnification device 100, a laminated-type piezoelectric element formed by laminating layers of piezoelectric materials typified by PZT ($PbZrO_3$—$PbTiO_3$) is used as the piezoelectric element 1.

In addition, the displacement magnification mechanism 2 comprises a supporting portion 3 supporting the piezoelectric element 1, a rectangular columnar movable portion 4 facing and spaced apart from the supporting portion 3 substantially in parallel, and a pair of mutually parallel link portions (first link portion 5 and second link portion 6), facing and spaced apart from each other in a direction orthogonally to a direction in which the supporting portion 3 faces the movable portion 4, that couple the supporting portion 3 to the movable portion 4.

The first link portion 5 comprises a rectangular columnar first rigid body 8 and a first plate spring 7 that couples the first rigid body 8 to the supporting portion 3 and the movable portion 4. The second link portion 6 comprises a rectangular columnar second rigid body 10 and a second plate spring 9 that couples the second rigid body 10 to the supporting portion 3 and the movable portion 4.

In the first link portion 5, the first plate spring 7 is one plate spring stretched between the supporting portion 3 and the movable portion 4 (this one plate spring is represented by reference numeral $7_0$ below), one end of this plate spring $7_0$ is fixed to the supporting portion 3 by a screw 11, and the other end of the plate spring $7_0$ is fixed to the movable portion 4 by a screw 12. The first rigid body 8 is located in a gap between the supporting portion 3 and the movable portion 4 and fixed to the portion of the plate spring $7_0$ between the supporting portion 3 and the movable portion 4 by screws 13 and 14.

In the second link portion 6, the second plate spring 9 is one plate spring (this one plate spring is represented by reference numeral $9_0$ below) stretched between the supporting portion 3 and the movable portion 4, one end of the plate spring $9_0$ is fixed to the supporting portion 3 by a screw 15, and the other end of the plate spring $9_0$ is fixed to the movable portion 4 by a screw 16. The second rigid body 10 is located in a gap between the supporting portion 3 and the movable portion 4 and fixed to the portion of the plate spring $9_0$ between the supporting portion 3 and the movable portion 4 by screws 17 and 18.

The supporting portion 3 has a seat portion 3a projecting toward the movable portion 4 side, and the piezoelectric element 1 is fixed to a portion between a side wall surface 3a1 of this seat portion 3a and a pressure receiving surface 8a1 of the first rigid body 8. The first rigid body 8 has a projection portion 8a projecting toward the piezoelectric element 1 side and the front end surface of this projection portion 8a is the pressure receiving surface 8a1 in contact with the piezoelectric element 1. In addition, the projection portion 8a of the first rigid body 8 has a small width in a root portion 8a2 connected to the first rigid body 8.

In this displacement magnification device 100, the supporting portion 3, the movable portion 4, the first rigid body 8, and the second rigid body 10 are made of carbon steel, and the plate spring $7_0$ and the plate spring $9_0$ are made of SS material (rolled steel for general structure). It should be noted here that the plate spring $7_0$ and the plate spring $9_0$ may be made of spring steel, stainless steel, or ceramic, or CFRP (carbon fiber reinforced plastics), and the materials of the supporting portion 3, the movable portion 4, the first rigid body 8, and the second rigid body 10 only need to be materials with a high rigidity equivalent to metal and are not limited to carbon steel. In addition, the rigidity with respect to the plate spring $7_0$ and the rigidity with respect to the plate spring $9_0$ may be adjusted by changing the lengths of the first rigid body 8 and the second rigid body 10.

When the piezoelectric element 1 is minutely displaced in the direction indicated by arrow A in this displacement magnification device 100, the force generated by this displacement is transmitted to the first link portion 5 via the pressure receiving surface 8a1 of the first rigid body 8. Then, the first link portion 5 having received the force from the piezoelectric element 1 is inclined about a connection portion J1 between the plate spring $7_0$ and the supporting portion 3 as the fulcrum with the principle of leverage (see FIG. 3), the second link portion 6 is also inclined by following the first link portion 5, and the movable portion 4 moves in the direction indicated by arrow B.

Figure 3:
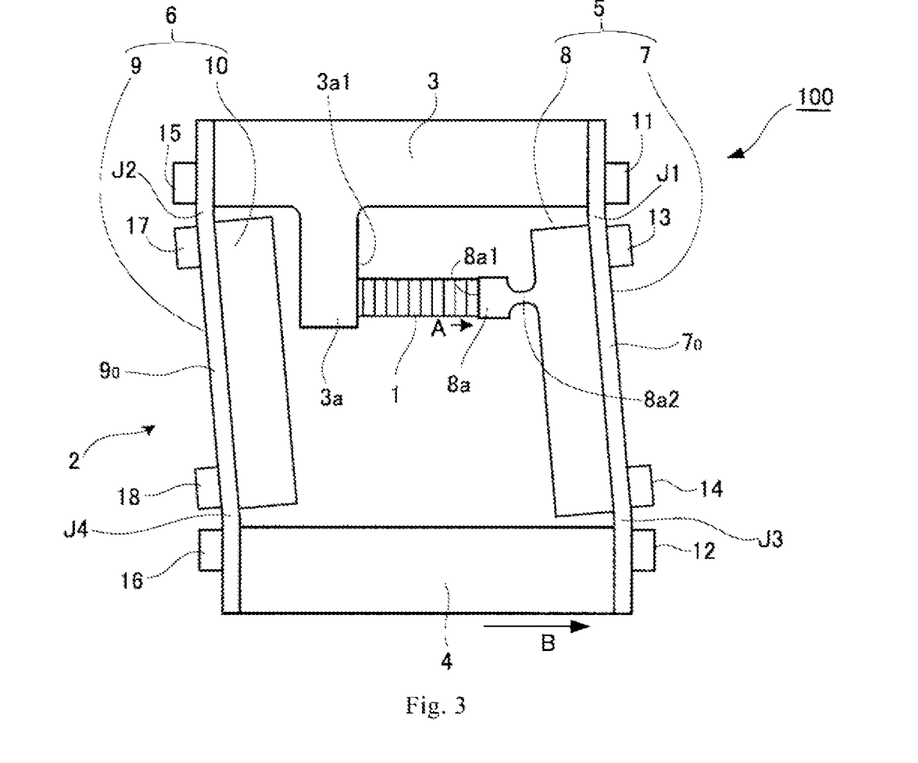
FIG. 3 illustrates the state in which a piezoelectric element is minutely displaced in the displacement magnification device according to embodiment 1.

That is, when the piezoelectric element 1 is minutely displaced in this displacement magnification device 100, the displacement magnification mechanism 2, which is like a substantially rectangular frame formed by the supporting portion 3, the movable portion 4, the first link portion 5, and the second link portion 6, is displaced and deformed to a parallelogram frame. This causes the displacement magnification mechanism 2 to magnify the amount of displacement of the piezoelectric element 1 and to output the magnified amount as the amount of displacement of the movable portion 4. In the embodiment, the amount of displacement of the movable portion 4 is approximately 34 µm and the displacement magnification ratio is 2.2 fold.

In this displacement magnification device 100, the first rigid body 8 and the second rigid body 10 play roles to suppress the bending of the plate spring $7_0$ and the plate spring $9_0$. In addition, the connection portion J1 between the plate spring $7_0$ and the supporting portion 3, the connection portion J2 between the plate spring $9_0$ and the supporting portion 3, the connection portion J3 between the plate spring $7_0$ and the movable portion 4, and the connection portion J4 between the plate spring $9_0$ and the movable portion 4 play the roles of elastic hinges. Accordingly, in this displacement magnification device 100, elastic hinges with a small width do not need to be created in one component, manufacture becomes easy by adopting a general machining method, such as milling, and productivity is improved.

In this displacement magnification device 100, the projection portion 8a of the first rigid body 8 has a small width in the root portion 8a2 so as to efficiently transmit the force from the piezoelectric element 1 to the first link portion 5. In addition, the width of reduction of the root portion 8a2 is large to enable creation via milling.

In addition, although the width of the root portion 8a2 of the projection portion 8a is small in this example, the width does not need to be small. That is, the entire projection portion 8a may have the same width as the pressure receiving surface 8a1. However, if the entire projection portion 8a has the same width as the pressure receiving surface 8a1, since a bending moment is generated when receiving the force from the piezoelectric element 1, the force transmitted to the first link portion 5 becomes small.

Embodiment 2

Figure 4:
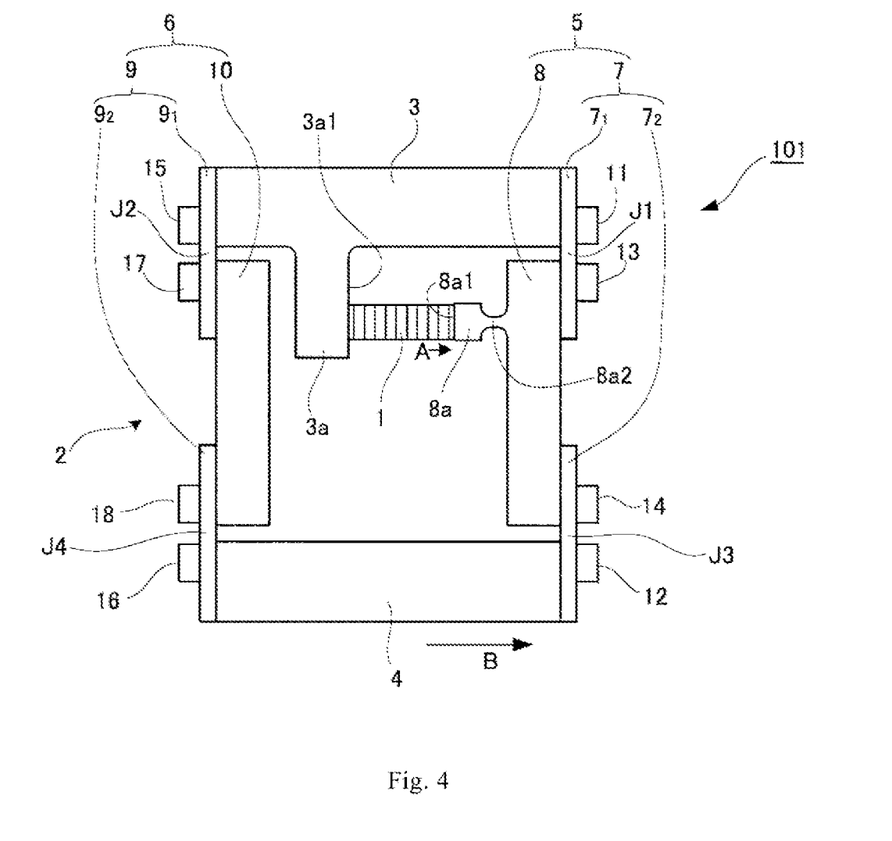
FIG. 4 is a plan view illustrating a main part of a displacement magnification device according to embodiment 2 of the invention.

FIG. 4 is a plan view illustrating a main part of a displacement magnification device 101 according to embodiment 2 of the invention. In this displacement magnification device 101, the first plate spring 7 comprises two plate springs $7_1$ and $7_2$, one end of the plate spring $7_1$ is fixed to the supporting portion 3, and the other end of the plate spring $7_1$ is fixed to the first rigid body 8. In addition, one end of the plate spring $7_2$ is fixed to the movable portion 4 and the other end of the plate spring $7_2$ is fixed to the first rigid body 8. In this structure, the plate spring $7_1$ corresponds to the first supporting-portion-side plate spring in the invention and the plate spring $7_2$ corresponds to the first movable-portion-side plate spring in the invention.

In addition, a second plate spring portion 9 comprises two plate springs $9_1$ and $9_2$, one end of the plate spring $9_1$ is fixed to the supporting portion 3, and the other end of the plate spring $9_1$ is fixed to the second rigid body 10. In addition, one end of plate spring $9_2$ is fixed to the movable portion 4 and the other end of the plate spring $9_2$ is fixed to the second rigid body 10. In this structure, the plate spring $9_1$ corresponds to the second supporting-portion-side plate spring in the invention and the plate spring $9_2$ corresponds to the second movable-portion-side plate spring in the invention.

In this displacement magnification device 101, the first rigid body 8 and the second rigid body 10 play roles to suppress the bending of the plate springs $7_1$ and $7_2$ and the plate springs $9_1$ and $9_2$. In addition, the connection portion J1 between the plate spring $7_1$ and the supporting portion 3, the connection portion J2 between the plate spring $9_1$ and the supporting portion 3, the connection portion J3 between the plate spring $7_2$ and the movable portion 4, and the connection portion J4 between the plate spring $9_2$ and the movable portion 4 play the roles of elastic hinges. Accordingly, also in the displacement magnification device 101 according to embodiment 2, elastic hinges with a small width do not need to be created in one component as in the displacement magnification device 100 according to embodiment 1, and manufacture becomes easy by adopting a general machining method, such as milling, and productivity is improved.

Figure 5:
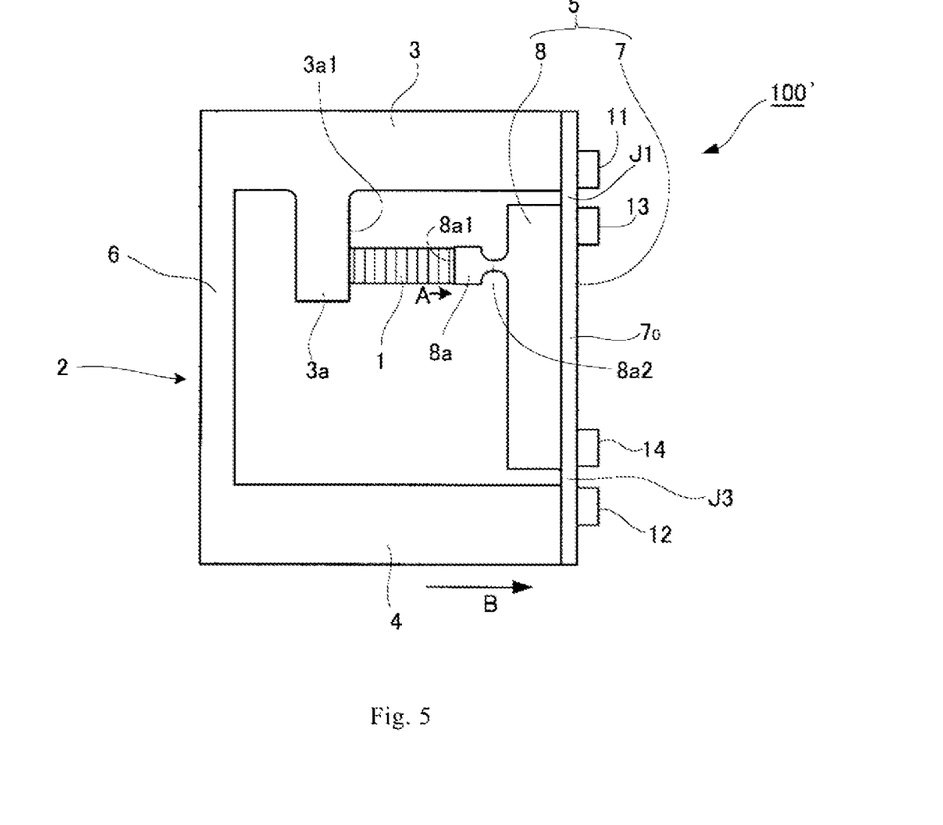
FIG. 5 is a plan view illustrating a displacement magnification device according to a modification of embodiment 1 of the invention.
Figure 6:
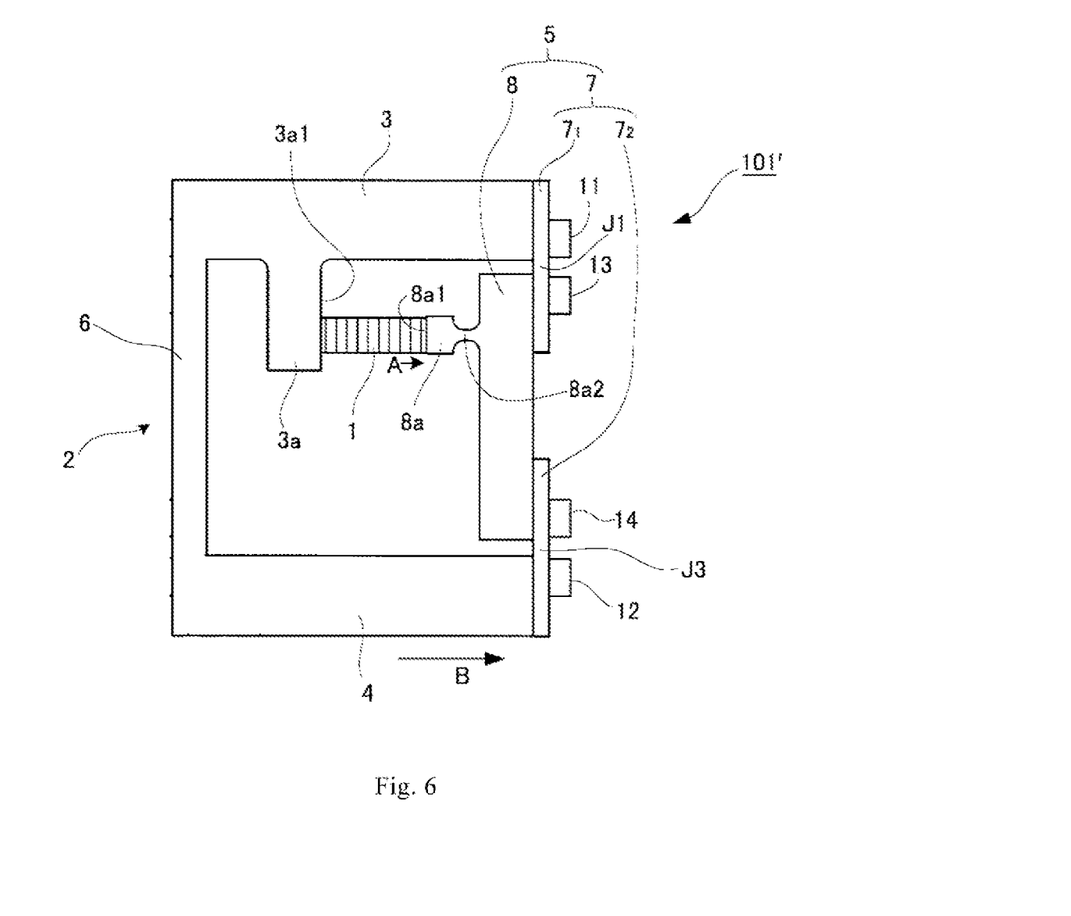
FIG. 6 is a plan view illustrating a displacement magnification device according to a modification of embodiment 2 of the invention.

Although the second link portion 6 comprises the second plate spring 9 and the second rigid body 10 in the displacement magnification device 100 illustrated in FIG. 1, as illustrated in the a displacement magnification device 100' in FIG. 5, the second link portion 6 may be a thin column formed integrally with the supporting portion 3 and the movable portion 4 so as to function as a plate spring as in the second link portion 26 of the conventional displacement magnification device 200 (FIG. 7). The displacement magnification device 101 illustrated in FIG. 4 may also incorporate the same integrated second link portion structure 6, as illustrated in a displacement magnification device 101' in FIG. 6.

Expansion of Embodiments

Although the invention has been described with reference to embodiments, the invention is not limited to the embodiments. Various changes that can be understood by those skilled in the art can be made to the structure and details of the invention within the spirit of the invention.

REFERENCE SIGNS LIST

1: piezoelectric element, 2: displacement magnification mechanism, 3: supporting portion, 3a: seat portion, 3a1: side wall surface, 4: movable portion, 5: first link portion, 6: second link portion, 7: first plate spring, $7_0$, $7_1$ to $7_2$: plate spring, 8: first rigid body, 8a: projection portion, 8a1: pressure receiving surface, 8a2: root portion, 9: second plate spring, $9_0$, $9_1$ to $9_2$: plate spring, 10: second rigid body, 100, 100', 101, 101': displacement magnification device

The invention claimed is:

1. A displacement magnification device comprising:
a piezoelectric element; and
a displacement magnification mechanism configured to magnify an amount of displacement of the piezoelectric element,
wherein the displacement magnification mechanism comprises:
a supporting portion supporting the piezoelectric element,
a movable portion facing and spaced apart from the supporting portion, and
a pair of mutually parallel link portions coupling the supporting portion to the movable portion,
wherein the piezoelectric element is mounted to the supporting portion so as to be displaced orthogonally to a direction in which the supporting portion faces the movable portion,
wherein one of the pair of link portions comprises:
a first rigid body having a pressure receiving surface that receives a force generated by displacement of the piezoelectric element, and
a first plate spring that couples the first rigid body to the supporting portion and the movable portion, and
wherein the first plate spring comprises:
a first supporting-portion-side plate spring that couples the supporting portion to the first rigid body, and
a first movable-portion-side plate spring that couples the movable portion to the first rigid body.

2. The displacement magnification device according to claim 1,
wherein the supporting portion has a seat portion that projects toward the movable portion, and
wherein the piezoelectric element is fixed between a side wall surface of the seat portion and the pressure receiving surface of the first rigid body.

3. The displacement magnification device according to claim 1,
wherein the first rigid body has a projection portion that projects toward the piezoelectric element, and
wherein a front end surface of the projection portion of the first rigid body functions as the pressure receiving surface and makes contact with the piezoelectric element.

4. The displacement magnification device according to claim 3, wherein the projection portion of the first rigid body has a small width in a root portion connected to the first rigid body.

5. The displacement magnification device according to claim 1, wherein the other of the pair of link portions comprises:
a second rigid body located between the supporting portion and the movable portion, and
a second plate spring that couples the second rigid body to the supporting portion and the movable portion.

6. The displacement magnification device according to claim 5,
wherein the second plate spring comprises one plate spring that is stretched between the supporting portion and the movable portion, and has one end fixed to the supporting portion and another end fixed to the movable portion, and
wherein the second rigid body is fixed to a portion of the second plate spring between the supporting portion and the movable portion.

7. The displacement magnification device according to claim 5, wherein the second plate spring comprises
a second supporting-portion-side plate spring that couples the supporting portion to the second rigid body, and
a second movable-portion-side plate spring that couples the movable portion to the second rigid body.

8. A displacement magnification device comprising:
a piezoelectric element; and
a displacement magnification mechanism configured to magnify an amount of displacement of the piezoelectric element,
wherein the displacement magnification mechanism comprises:
a supporting portion supporting the piezoelectric element,
a movable portion facing and spaced apart from the supporting portion, and
a pair of mutually parallel link portions coupling the supporting portion to the movable portion,
wherein the piezoelectric element is mounted to the supporting portion so as to be displaced orthogonally to a direction in which the supporting portion faces the movable portion,
wherein one of the pair of link portions comprises a first rigid body having a pressure receiving surface that receives a force generated by displacement of the piezoelectric element, and a first plate spring that couples the first rigid body to the supporting portion and the movable portion,
wherein the first plate spring comprises one plate spring that is stretched between the supporting portion and the movable portion, and has one end fixed to the supporting portion and another end fixed to the movable portion, and
wherein the first rigid body is fixed to a portion of the first plate spring between the supporting portion and the movable portion.

9. The displacement magnification device according to claim 8, wherein
the supporting portion has a seat portion that projects toward the movable portion and
the piezoelectric element is fixed between a side wall surface of the seat portion and the pressure receiving surface of the first rigid body.

10. The displacement magnification device according to claim 8, wherein
the first rigid body has a projection portion that projects toward the piezoelectric element and
a front end surface of the projection portion of the first rigid body functions as the pressure receiving surface and makes contact with the piezoelectric element.

11. The displacement magnification device according to claim 10,
wherein the projection portion of the first rigid body has a small width in a root portion connected to the first rigid body.

12. The displacement magnification device according to claim 8,
wherein the other of the pair of link portions comprises
a second rigid body located between the supporting portion and the movable portion and
a second plate spring that couples the second rigid body to the supporting portion and the movable portion.

13. The displacement magnification device according to claim 12,
wherein the second plate spring comprises one plate spring that is stretched between the supporting portion and the movable portion and has one end fixed to the supporting portion and another end fixed to the movable portion, and wherein the second rigid body is fixed to a portion of the second plate spring between the supporting portion and the movable portion.

14. The displacement magnification device according to claim 12, wherein the second plate spring comprises a second supporting-portion-side plate spring that couples the supporting portion to the second rigid body and a second movable-portion-side plate spring that couples the movable portion to the second rigid body.

* * * * *